United States Patent
Xiong et al.

(10) Patent No.: US 7,939,393 B2
(45) Date of Patent: May 10, 2011

(54) METHOD OF ADJUSTING FDSOI THRESHOLD VOLTAGE THROUGH OXIDE CHARGES GENERATION IN THE BURIED OXIDE

(75) Inventors: Weize Xiong, Plano, TX (US); Cloves Rinn Cleavelin, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 447 days.

(21) Appl. No.: 12/062,968

(22) Filed: Apr. 4, 2008

(65) Prior Publication Data

US 2009/0253253 A1 Oct. 8, 2009

(51) Int. Cl.
*H01L 21/337* (2006.01)
(52) U.S. Cl. .......... 438/194; 257/E21.464; 257/E21.561
(58) Field of Classification Search .................. 438/194; 257/E21.464, E21.466, E21.32, E21.561
See application file for complete search history.

(56) References Cited

U.S. PATENT DOCUMENTS

| | | | |
|---|---|---|---|
| 6,872,640 B1 * | 3/2005 | Mouli | 438/514 |
| 2005/0087811 A1 * | 4/2005 | Liao et al. | 257/368 |
| 2005/0269640 A1 * | 12/2005 | Shimamoto et al. | 257/351 |
| 2006/0086934 A1 * | 4/2006 | Iwamatsu et al. | 257/59 |
| 2006/0289920 A1 * | 12/2006 | Wu et al. | 257/310 |
| 2008/0057668 A1 * | 3/2008 | Okamura | 438/424 |

OTHER PUBLICATIONS

Domae, Yasuhiro et al., "Suppression of Floating Body Effect in Low Leakage FD-SOI with Fluorine Implantation Technology," SOI Conference 2006.
Inoue, M. et al., "Fluorine Incorporation into HfSiON Dielectric for $V_{th}$ Control and Its Impact on Reliability for Poly-Si Gate pFET," IEDM 2005.
Chang, Leland et al., "Gate Length Scaling and Threshold Voltage Control of Double-Gate MOSFETs," IEDM 2003.
Xiong, W. et al., "Influence of Fluorine Implant on Threshold Voltage for Metal Gate FDSOI and MuGFET," 2007 IEEE International SOI Conference, Oct. 2007, Indian Wells, CA.

* cited by examiner

*Primary Examiner* — Caridad M Everhart
(74) *Attorney, Agent, or Firm* — Warren L. Franz; Wade J. Brady, III; Frederick J. Telecky, Jr.

(57) ABSTRACT

Different performance MOSFET Fully Depleted devices can be achieved on a single chip by varying the Vt through ion implantation. The integration of multiple Vt can be achieved through the selection of a metal gate stack with suitable effective WF for one semiconductor device to be included on a chip. Then, an ion implantation, with a dopant such as F, can be selectively performed to achieve proper Vt for other semiconductor devices on the chip.

27 Claims, 4 Drawing Sheets

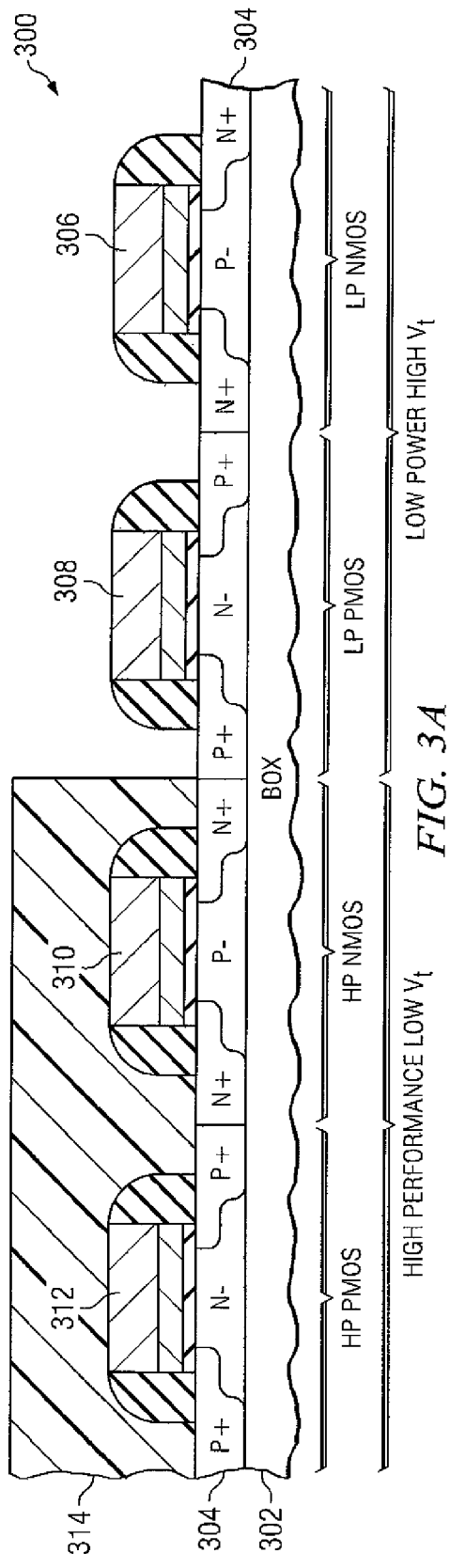
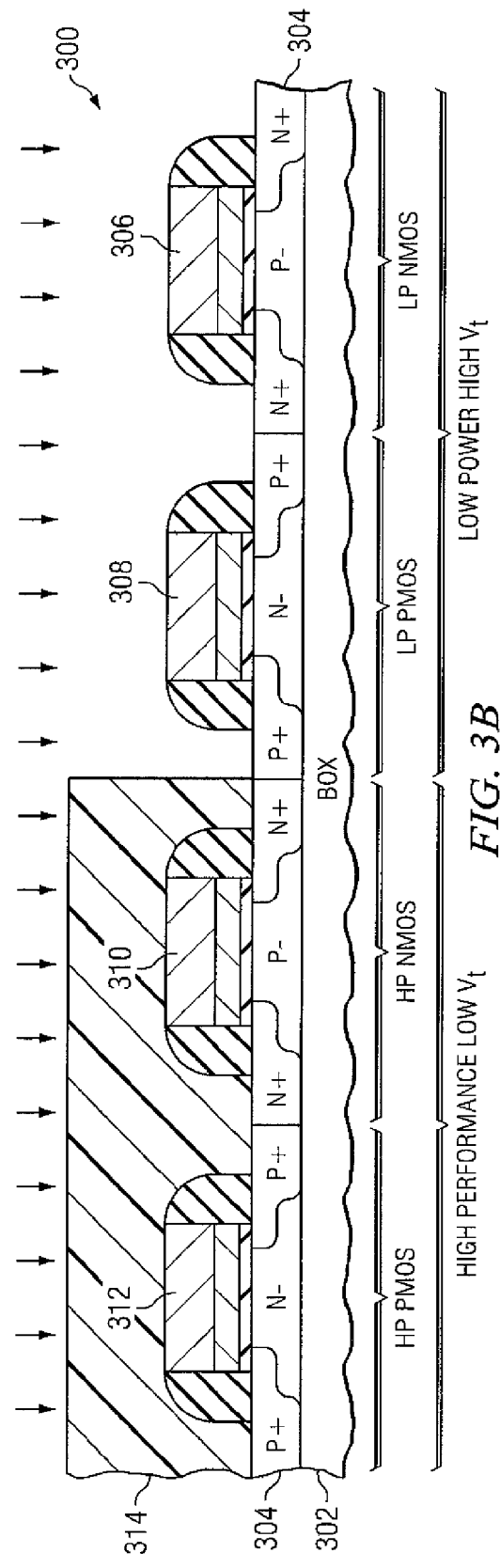
FIG. 3A
FIG. 3B

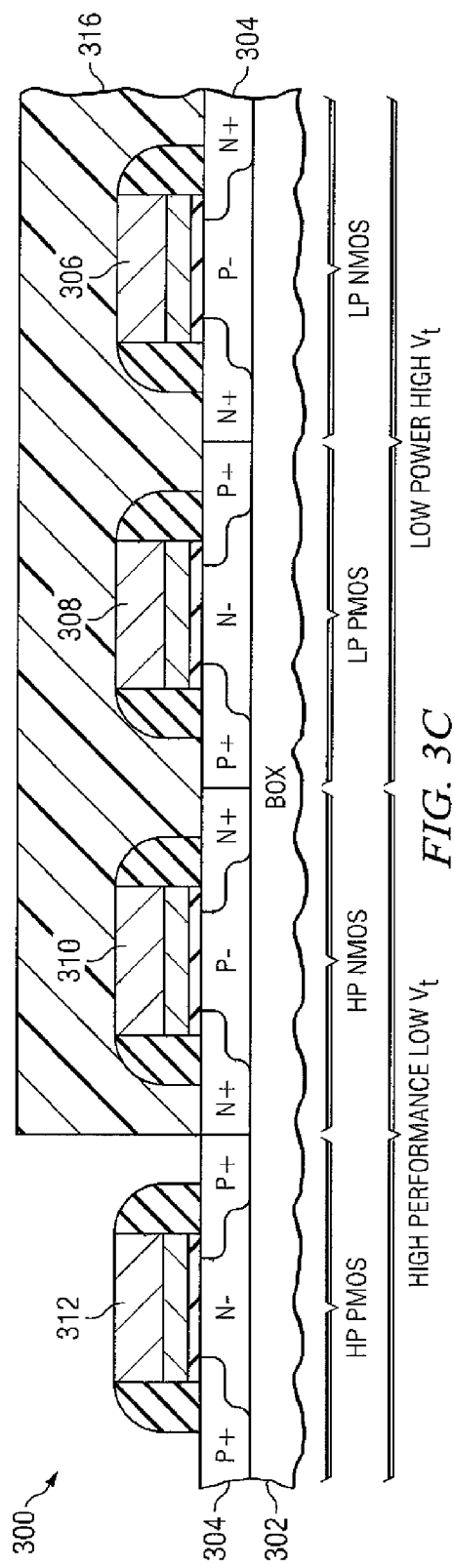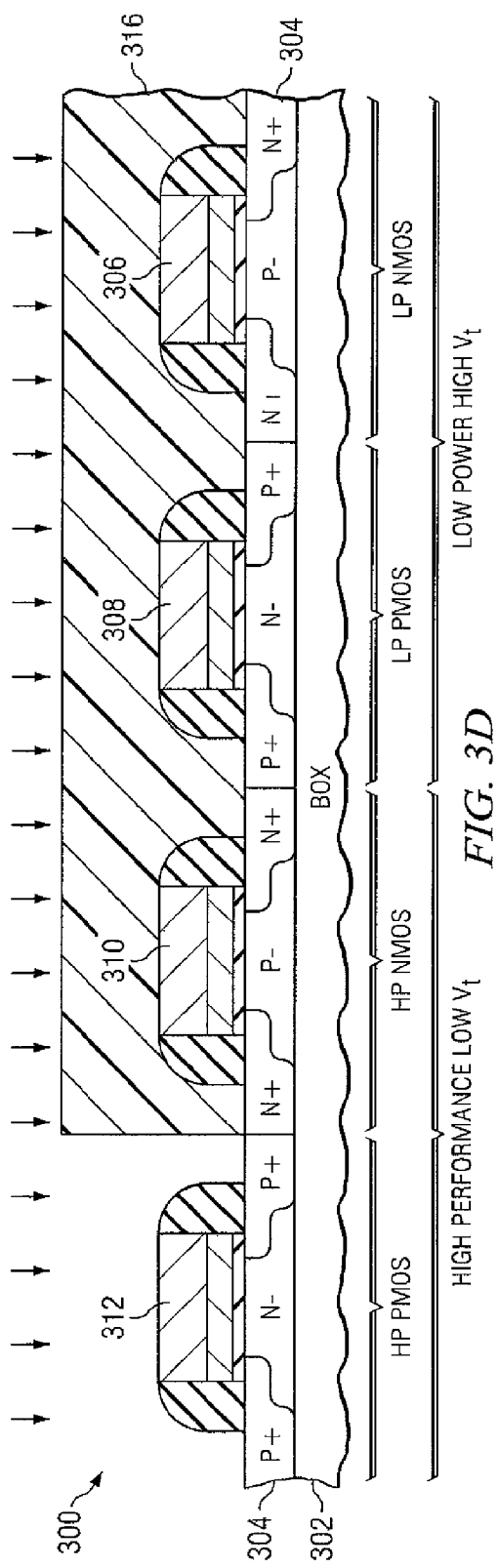

METHOD OF ADJUSTING FDSOI THRESHOLD VOLTAGE THROUGH OXIDE CHARGES GENERATION IN THE BURIED OXIDE

FIELD

This invention relates generally to semiconductor fabrication.

BACKGROUND

The effective work function (WF) of a gate stack sets the threshold voltages (Vt) of fully depleted, thin-body complementary metal oxide semiconductor (CMOS) devices such as metal oxide semiconductor field effect transistors (MOSFETs). The Vt of a CMOS device is the voltage, applied to the gate, that is necessary to open a conductive channel between source and drain of the device. For high-performance (HP) CMOS Fully Depleted (FD) devices, a desirable effective WF is +/−0.2 eV away from mid-band-gap. For low-power (LP) CMOS FD devices, a mid-band-gap effective WF alone is enough. One method of modulating the effective WF of a CMOS device is ion implantation. For example, Fluorine (F) implants can modulate the effective WF through the creation of negative charge states at the Si and gate dielectric interfaces.

System-on-Chip (SoC) applications often include both LP CMOS devices and HP CMOS devices which themselves include multiple semiconductor types of CMOS devices such as P-type CMOS (PMOS) devices and N-type CMOS (NMOS) devices. The LP CMOS devices and HP CMOS devices require gate stacks with different effective WF and the NMOS devices and PMOS devices may require different effective WF. As such, SoC applications require the integration of multiple effective WF gate stacks on the same chip. However, individually forming each gate for the different CMOS devices requires additional processing steps.

As such, there is a need for methods for forming semiconductor devices with different effective WF without adversely affecting other devices on the same chip. Additionally, the implantations of ions such as F can modulate the effective WF of some devices and adversely affect other devices. As such, there is a need for methods for forming semiconductor devices with different effective WF without adversely affecting other devices on the same chip.

BRIEF SUMMARY

An embodiment is directed to a method of fabricating semiconductor on insulator (SOI) devices. The method includes forming a first mask to cover at least one first-type semiconductor device and to expose at least one second-type semiconductor device. The at least one first-type semiconductor device and the at least one second-type semiconductor device include a gate formed of a same structure with a same effective work function. The method also includes performing an ion implantation to alter a threshold voltage of the at least one second-type semiconductor device.

Another embodiment is directed to a method of fabricating semiconductor on insulator (SOI) devices. The method includes forming a first mask to cover a first N-type semiconductor device and a first P-type semiconductor device and to leave open a second N-type semiconductor device and a second P-type semiconductor device. Each of the first N-type semiconductor device, first P-type semiconductor device, second N-type semiconductor device, and second P-type semiconductor device include a gate formed of a same structure with a same effective work function. The method also includes performing an ion implantation to alter a threshold voltage of the second N-type semiconductor device and the second P-type semiconductor device; forming a second mask to cover the second N-type semiconductor device, the second P-type semiconductor device and the first N-type semiconductor device and to leave open the first P-type semiconductor device; and performing an ion implantation to alter a threshold voltage of the first P-type semiconductor device.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the disclosure and together with the description, serve to explain the principles of the embodiments.

FIGS. 3A-3D are general schematic diagrams of an exemplary process of modulating the effective WF according to certain embodiments.

DETAILED DESCRIPTION

According to embodiments, different performance MOSFET devices can be achieved on a single chip by varying the Vt through ion implantation. The integration of multiple Vt can be achieved through the selection of a metal gate stack with suitable effective WF for one semiconductor device to be included on a chip. Then, an ion implantation, with a dopant such as F, can be selectively performed to achieve proper Vt for other semiconductor devices on the chip.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
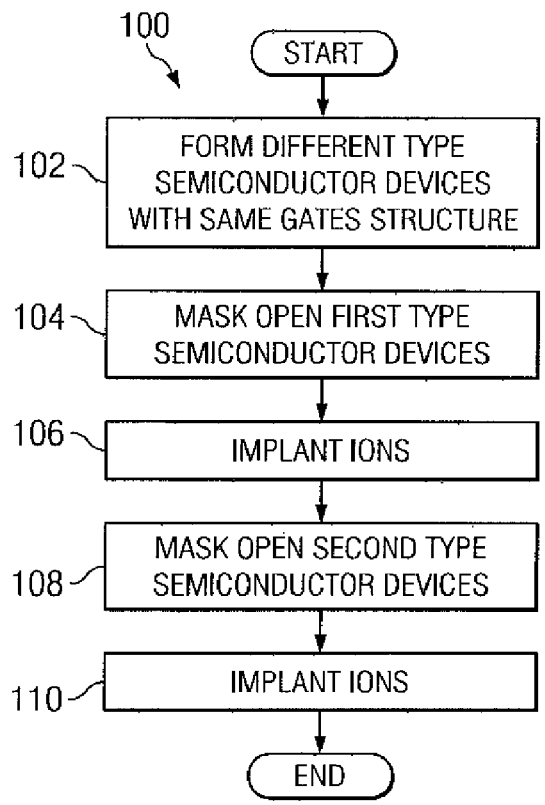
FIG. 1 is a flow diagram illustrating an exemplary process according to certain embodiments.

FIG. 1 is a flow diagram illustrating a method 100 of fabricating a semiconductor device consistent with embodiments of the present disclosure. It should be readily apparent to those skilled in the art that FIG. 1 is exemplary and that other steps can be added.

Method 100 begins with different type semiconductor devices being formed on a substrate, in step 102. For example, the different type semiconductor devices can be different CMOS devices such as NMOS and PMOS devices and different performance devices such as LP CMOS devices and HP CMOS devices. According to embodiments, gates of the different semiconductor devices can be formed with a suitable effective WF for one type of the semiconductor devices. For example, the semiconductor devices can be formed with a gate stack that has a suitable effective WF for a HP NMOS device.

Because the gates for the different type semiconductor devices have the same effective WF, the effective WF of the gates must be modulated to achieve a desired Vt for each semiconductor device. As such, in step 104, a mask is formed covering a first-type semiconductor device and leaving open a second-type semiconductor device. For example, the gates of all the semiconductor devices can be formed to be with an effective WF ideal for the first-type semiconductor device. Accordingly, the effective WF of the second-type semiconductor device must be modulated in order to achieve the desired Vt for the second-type semiconductor device.

To achieve this, an ion implantation is performed, in step 106. In the ion implantation, ions are implanted to alter the effective WF of the second-type semiconductor device to achieve the desired Vt. For example, if the second-type semiconductor device is a PMOS device, F ions can be implanted in order to alter the effective WF of the PMOS device.

Additionally, the effective WF of the first-type semiconductor device can also be modulated. To achieve this, a mask is formed covering the second-type semiconductor device and leaving open the first-type semiconductor device, step 108. Then, an ion implantation is performed, in step 110. In the ion implantation, ions are implanted to alter the effective WF of the first-type semiconductor device to achieve the desired Vt.

Figure 2:
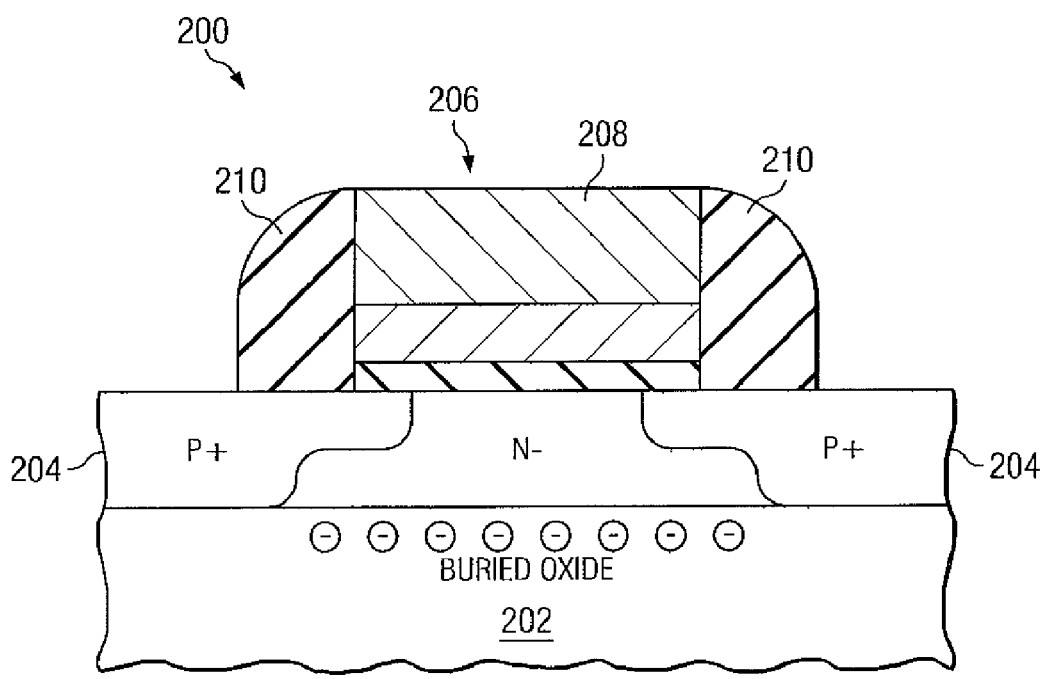
FIG. 2 is a general schematic diagram of a MOSFET according to certain embodiments.

According to embodiments, the effective WF of different semiconductor devices can be selectively modulated utilizing masks and ion implantation. FIG. 2 is a diagram illustrating a fully-depleted MOSFET device such as HP or LP PMOS. As illustrated, MOSFET 200 includes a buried oxide layer 202, substrate 204, and a gate 206. It should be readily apparent to those of ordinary skill in the art that MOSFET 200 illustrated in FIG. 2 represents a generalized illustration and that other components can be added or existing components may be removed or modified.

Buried oxide layer 202 can be formed from any suitable oxide material. Substrate 204 can be formed from any suitable semiconductor material, such as silicon. For example, substrate 204 can be a top silicon (SI) layer with an oxide layer 202, such as SiO2, buried in substrate 204. Substrate 204 can include an N-type well region formed under gate 206.

Buried oxide layer 202 and substrate 204 can be formed utilizing any well-known technique available in semiconductor processing.

MOSFET 200 includes one of a source region, including a source, or a drain region, including a drain. Both the source and the drain can be formed in the source region and the drain region, respectively, using any suitable techniques used in semiconductor processing, such as ion implantation. As shown, for example, boron or other suitable P-type dopant can be implanted during the ion implantation process to form the source and the drain. Although not illustrated in FIG. 2, both the source and the drain can have heavily doped and lightly doped regions. After the ion implantation in the source region and drain region, an anneal process can be performed for diffusion of the dopant. One skilled in the art will realize that this anneal process can be carried out at any suitable temperature for any suitable time period.

Gate 206 can include a gate stack 208 and sidewalls 210. Gate stack 208 can be formed using any suitable growth and/or deposition techniques using semiconductor processing and can be formed from any suitable material or combination of material. Gate stack 208 can comprise a metal gate stack, such as a gate oxide, metal layer, and capping layer. For example, the metal gate stack can comprise an in situ steam generated (ISSG) gate oxide, TiN metal layer, and AmSi capping layer. Gate stack 208 can be formed with a suitable effective WF for either a HP PMOS or LP PMOS.

Sidewalls 210 can be formed using any suitable growth and/or deposition techniques available in semiconductor processing and can be formed from any suitable dielectric materials, such as oxide, nitride, a combination of oxide and nitride, or other suitable materials. FIG. 2 illustrates a pair of sidewalls but one skilled in the art will realize that gate 206 may include additional sidewalls.

As described above in FIG. 2, MOSFET 200 can serve as a PMOS device. Alternatively, MOSFET 200 can serve as a NMOS device. As such, substrate 204 can include a P-type well region formed under gate 206. MOSFET 200 would include one of a source region, including a source, or a drain region, including a drain. Both the source and the drain can be formed in the source region and the drain region, respectively, using any suitable techniques used in semiconductor processing, such as ion implantation. If MOSFET 200 is an NMOS device, then arsenic, phosphorous, antimony, or other suitable N-type dopant can be implanted in substrate 204 during the ion implantation process to form the source and the drain.

In MOSFET 200, charges in buried oxide layer 202 affects the Vt of MOSFET 200. Negative charges lead to a higher NMOS Vt and lower PMOS Vt. Positive charges lead to a higher PMOS Vt and lower NMOS Vt. The Vt of MOSFET 200 can be modulated by changing the charges in buried oxide layer 202 through implantation of ions.

FIG. 3A-3D are generalized diagrams illustrating a method for creating a device 300 with different performance MOSFET devices by varying the Vt through ion implantation. According to embodiments, the integration of multiple Vt can be achieved through the selection of a metal gate stack with suitable effective WF for a HP NMOS. Then, an ion implantation, with a dopant such as F, can be selectively performed to achieve proper Vt for LP CMOS devices and HP PMOS devices. The ion implantation alters the negative charge states in the buried oxide layer.

As illustrated in FIG. 3A, device 300 comprises several LP and HP CMOS devices. Device 300 comprises SOI structure including a buried oxide layer 302 and semiconductor substrate 304. Device 300 also comprises a LP NMOS device 306, LP PMOS device 308, HP NMOS device 310, and HP PMOS device 312. One skilled in the art will realize that device 300 is exemplary and that device 300 can include fewer or additional MOSFET devices.

LP NMOS 306, LP PMOS 308, HP NMOS 310, and HP PMOS 312 can include any standard components of a MOSFET. For example, LP NMOS 306, LP PMOS 308, HP NMOS 310, and HP PMOS 312 can be construed as illustrated in FIG. 2 with the appropriate well regions including source and drain regions.

According to embodiments, a LP NMOS 306, LP PMOS 308, HP NMOS 310, and HP PMOS 312 include a gate structure with a suitable effective WF for an HP NMOS. The gate structures can include a metal gate stack, such as a gate oxide, metal layer, and capping layer. For example, the metal gate stack can include an ISSG gate oxide, TiN metal layer, and AmSi capping layer. The metal gate structure can be formed with a suitable WF for an HP NMOS, for example, approximately 4.3 to approximately 4.5 eV.

To achieve the proper Vt for the MOSFET devices, ion implantation is performed to alter the Vt of the MOSFET devices. As shown in FIG. 3A, a mask 314 is formed over HP NMOS 310 and HP PMOS 312. Mask 314 can be any type of suitable material and formed to an appropriate thickness to block ions from being implanted. For example, mask 314 can be a photo resist layer and mask 314 can be approximately 4 to approximately 5 times thicker than the thickness of a Si top layer of the SOI structure. One skilled in the art will realize that mask 314 can be formed of any type of suitable material and formed to an appropriate thickness to block ions from being implanted.

Then, as illustrated in FIG. 3B, ions are implanted in the unmasked portion to alter the Vt of LP NMOS 306 and LP PMOS 308. The ion implantation can be performed utilizing any type of suitable dopant and with any suitable technique in order to shift the Vt for LP CMOS devices. For example, F ions can be implanted at a dose in a range of approximately $1\times10^{14}/cm^2$ to approximately $2\times10^{14}/cm^2$, with energy high enough to place the implanted F peak concentration at the Si top layer and the buried oxide interface. The Vt for LP NMOS 306 and LP PMOS 308 can be shifted to approximately +/−0.4V. One skilled in the are will realize that the Vt for LP NMOS 306 and LP PMOS 308 can be shifted to any value depending on the requirements of the MOSFET devices.

Next, as illustrated in FIG. 3C, mask 314 is removed. Mask 314 can be removed utilizing any type of suitable technique, such as etching. Then, a second mask 316 is formed to cover LP NMOS 306, LP PMOS 308, and HP NMOS 310. Mask 316 can be any type of suitable material and formed to an appropriate thickness to block ions from being implanted. For example, mask 316 can be a photo resist layer and mask 316 can be approximately 4 to approximately 5 times thicker than the thickness of a Si top layer of the SOI structure. One skilled in the art will realize that mask 316 can be formed of any type of suitable material and formed to an appropriate thickness to block ions from being implanted.

Then, as illustrated in FIG. 3D, ions are implanted in the unmasked portion to alter the Vt of HP PMOS 312. The ion implantation can be performed utilizing any type of suitable dopant and with any suitable technique in order to shift the Vt for HP CMOS device. For example, F ions can be implanted at a dose in the range of approximately $3\times10^{14}/cm^2$ to approximately $4\times10^{14}/cm^2$, with energy high enough to place the implanted F peak concentration at the Si top layer and the buried oxide interface. The Vt for HP PMOS 312 can be shifted to approximately 0.2V. One skilled in the are will realize that the Vt for HP PMOS 312 can be shifted to any value depending on the requirements of the MOSFET device.

According to embodiments, as described above, different performance MOSFET devices can be achieved by varying the Vt through ion implantation. The integration of multiple Vt can be achieved through the selection of a metal gate stack with suitable effective WF for a HP NMOS. Then, an ion implantation, with a dopant such as F, can be selectively performed to achieve proper Vt for LP CMOS devices and HP PMOS devices. The ion implantation alters the negative charge states in the buried oxide layer.

One skilled in the art will realize that the selection of a suitable effective WF for a HP NMOS device is exemplary. According to embodiments, the LP CMOS devices and HP CMOS devices can be formed with a suitable effective WF for other devices such as PMOS devices. Accordingly, the PMOS device can be masked and the other CMOS devices modulated through ion implantation. Additionally, one skilled in the art will realize that the use of F is exemplary and that other materials can be utilized during the ion implantation. For example, Nitrogen (N) can be implanted to create positive charges in the oxide.

Figure 4:
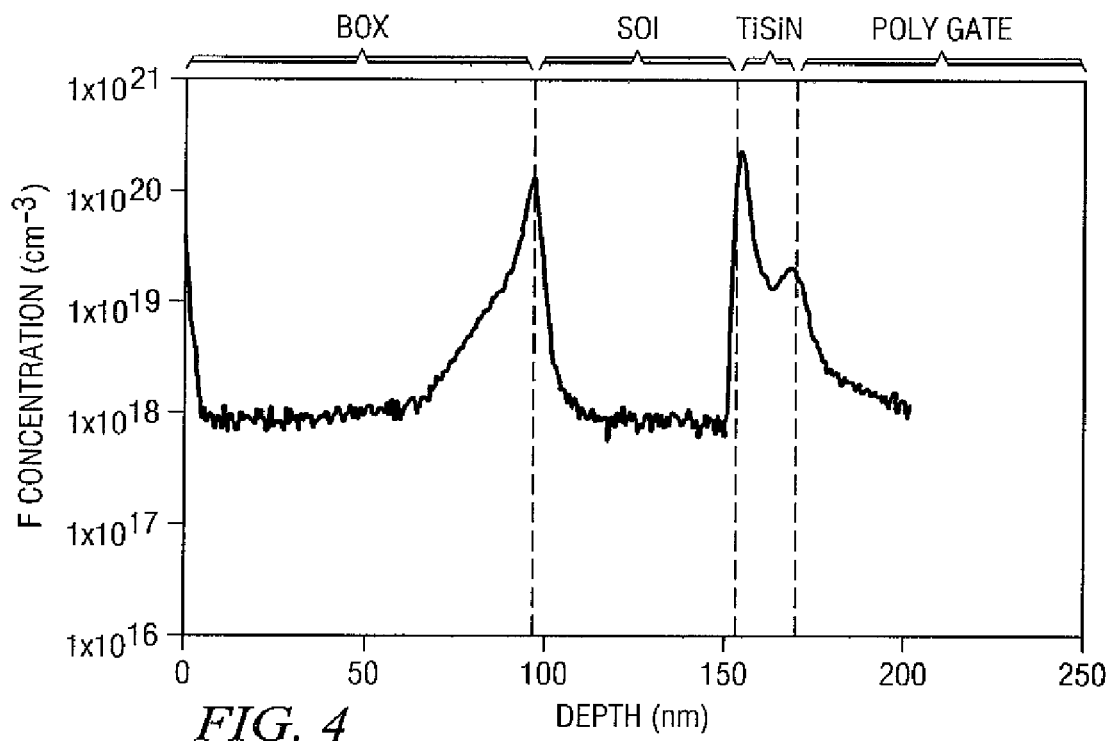
FIGS. 4 and 5 are diagrams illustrating exemplary results of a device according to certain embodiments.
Figure 5:
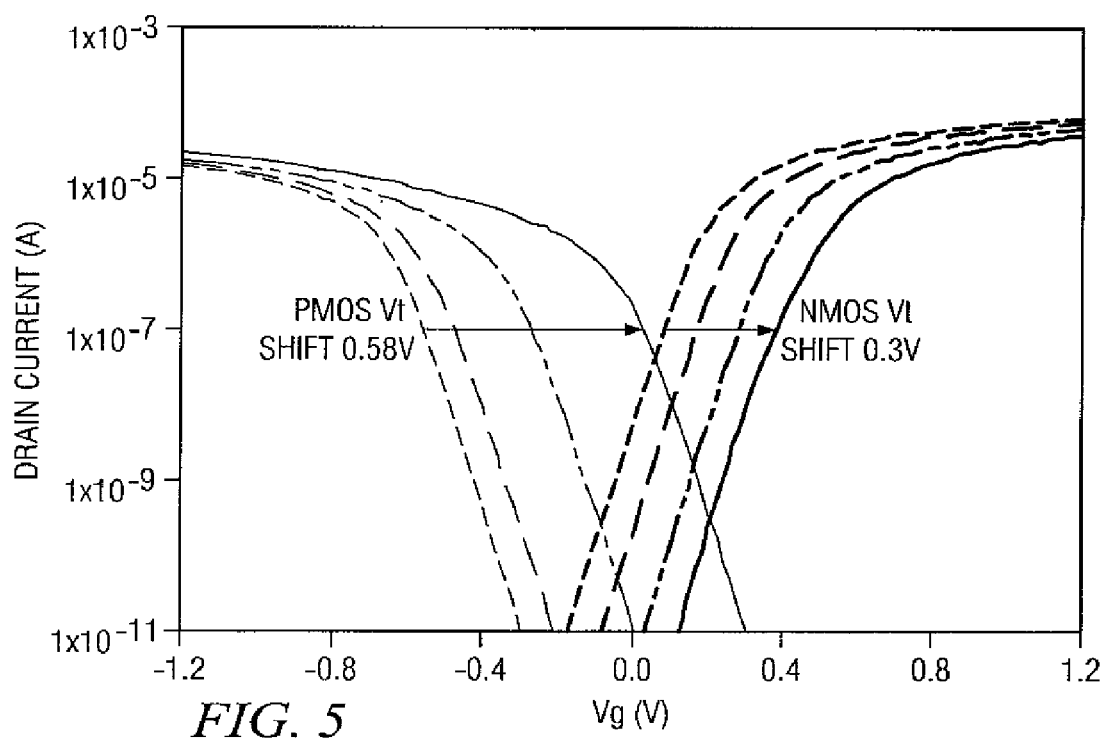

FIGS. 4 and 5 are diagrams illustrating experimental results from a MOSFET device fabricated utilizing the methods described above. FIG. 4 is a diagram illustrating a secondary ion mass spectroscopy (SIMS) analysis of the F profile in the MOSFET channel after device fabrication. As illustrated, F piles up at both front gate oxide interface and in the buried oxide (BOX). The high F pile-up at the Si/BOX interface plays a role in Vt modulation.

FIG. 5 is a diagram illustrating a CMOS planar FDSOI long-channel $I_D$ VS. $V_G$ NMOS and PMOS Vt shift has asymmetrical response to F-implant. As illustrated, the PMOS Vt shift was 0.58V compared to 0.3V shift for NMOS with $5\times10^{14}/cm^2$ F implant.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating semiconductor on insulator (SOI) devices, comprising:
    forming a first mask to cover at least one first-type semiconductor device and to expose at least one second-type semiconductor device, wherein the at least one first-type semiconductor device and the at least one second-type semiconductor device include respective gates formed of a same structure with a same effective work function; and
    performing an ion implantation to alter a threshold voltage of the at least one second-type semiconductor device, wherein the ion implantation comprises implanting F ions.

2. The method of claim 1, further comprising:
    forming a second mask to cover the at least one second-type semiconductor device and to expose the at least one second-type semiconductor device, wherein the at least one first-type semiconductor device and the at least one second-type semiconductor device include respective gates formed of a same structure with a same effective work function; and
    performing an ion implantation to alter a threshold voltage of the at least one first-type semiconductor device.

3. The method of claim 2, wherein performing the ion implantation to alter the threshold voltage of the at least one first-type semiconductor device comprises implanting F ions.

4. A method of fabricating semiconductor on insulator (SOI) devices, comprising:
forming a first mask to cover at least one first-type semiconductor device and to expose at least one second-type semiconductor device, wherein the at least one first-type semiconductor device and the at least one second-type semiconductor device include respective gates formed of a same structure with a same effective work function; and
performing an ion implantation to alter a threshold voltage of the at least one second-type semiconductor device, wherein performing the ion implantation comprises implanting N ions.

5. The method of claim 4, further comprising:
forming a second mask to cover the at least one second-type semiconductor device and to expose the at least one second-type semiconductor device, wherein the at least one first-type semiconductor device and the at least one second-type semiconductor device include respective gates formed of a same structure with a same effective work function; and
performing an ion implantation to alter a threshold voltage of the at least one first-type semiconductor device.

6. The method of claim 5, wherein performing an ion implantation to alter a threshold voltage of the at least one first-type semiconductor device comprises implanting N ions.

7. A method of fabricating semiconductor on insulator (SOI) devices, comprising:
forming a first mask to cover a first N-type semiconductor device and a first P-type semiconductor device and to leave open a second N-type semiconductor device and a second P-type semiconductor device, wherein each of the first N-type semiconductor device, first P-type semiconductor device, second N-type semiconductor device, and second P-type semiconductor device includes a gate formed of a same structure with a same effective work function;
performing an ion implantation to alter a threshold voltage of the second N-type semiconductor device and the second P-type semiconductor device;
forming a second mask to cover the second N-type semiconductor device, the second P-type semiconductor device and the first N-type semiconductor device and to leave open the first P-type semiconductor device; and
performing an ion implantation to alter a threshold voltage of the first P-type semiconductor device.

8. The method of claim 7, further comprising removing the first mask prior to forming the second mask.

9. The method of claim 7, wherein the first mask is formed to a thickness in a range of approximately 4 times to approximately 5 times thicker than a top Si layer thickness of the SOI devices.

10. The method of claim 7, wherein the second mask is formed to a thickness in a range of approximately 4 times to approximately 5 times thicker than a top Si layer thickness of the SOI devices.

11. The method of claim 7, further comprising:
forming the first N-type semiconductor device on a SOI substrate;
forming the second N-type semiconductor device on the SOI substrate;
forming the first P-type semiconductor device on the SOI substrate; and
forming the second P-type semiconductor device on the SOI substrate.

12. The method of claim 7, wherein performing the ion implantation to alter the threshold voltage of the second N-type semiconductor device and the second P-type semiconductor device comprises implanting N ions.

13. The method of claim 7, wherein performing the ion implantation to alter the threshold voltage of the first P-type semiconductor device comprises implanting N ions.

14. The method of claim 7, wherein the gate has an effective work function suitable for a high performance N-type semiconductor device.

15. The method of claim 14, wherein the effective work function is approximately 4.3 to approximately 4.5 eV.

16. The method of claim 7, wherein the gate comprises a metal gate stack.

17. The method of claim 16, wherein the metal gate stack comprises:
a gate oxide positioned adjacent to a SOI substrate;
a metal layer positioned adjacent to the gate oxide; and
a capping layer positioned adjacent to the metal layer.

18. The method of claim 7, wherein performing the ion implantation to alter the threshold voltage of the second N-type semiconductor device and the second P-type semiconductor device comprises implanting F ions.

19. The method of claim 18, wherein performing the ion implantation to alter the threshold voltage of the first P-type semiconductor device comprises implanting F ions.

20. The method of claim 18, wherein performing the ion implantation to alter the threshold voltage of the second N-type semiconductor device and the second P-type semiconductor device comprises implanting F ions to provide an implanted F peak concentration at a top Si layer and a buried oxide interface.

21. The method of claim 20, wherein performing the ion implantation to alter the threshold voltage of the second N-type semiconductor device and the second P-type semiconductor device comprises implanting F ions at a dose in a range of approximately $1\times10^{14}/cm^2$ to approximately $2\times10^{14}/cm^2$.

22. The method of claim 7, wherein performing the ion implantation to alter the threshold voltage of the first P-type semiconductor device comprises implanting F ions.

23. The method of claim 22, wherein performing the ion implantation to alter the threshold voltage of the first P-type semiconductor device comprises implanting F ions to provide an implanted F peak concentration at a top Si layer and a buried oxide interface.

24. The method of claim 23, wherein performing the ion implantation to alter the threshold voltage of the first P-type semiconductor device comprises implanting F ions at a dose in a range of approximately $3\times10^{14}/cm^2$ to approximately $4\times10^{14}/cm^2$ range.

25. A method of fabricating semiconductor on insulator (SOI) devices, comprising:
forming a first mask to cover a first N-type semiconductor device and a first P-type semiconductor device and to leave open a second N-type semiconductor device and a second P-type semiconductor device, wherein each of the first N-type semiconductor device, first P-type semiconductor device, second N-type semiconductor device, and second P-type semiconductor device include a respective gate comprising a same metal gate stack and having a same effective work function;
performing F ion implantation to alter a threshold voltage of the second N-type semiconductor device and the second P-type semiconductor device;
forming a second mask to cover the second N-type semiconductor device, the second P-type semiconductor device and the first N-type semiconductor device and to leave open the first P-type semiconductor device; and performing F ion implantation to alter a threshold voltage of the first P-type semiconductor device.

26. The method of claim 25, wherein the gate has an effective work function suitable for a high performance N-type semiconductor device.

27. The method of claim 25, wherein the first N-type semiconductor device and first P-type semiconductor device form high performance CMOS fully depleted devices and the second N-type semiconductor device and second P-type semiconductor device form low-power CMOS fully depleted devices.

\* \* \* \* \*